United States Patent [19]

Dietz

[11] 3,936,115
[45] Feb. 3, 1976

[54] START-UP CIRCUIT FOR A DEFLECTION SYSTEM

[75] Inventor: Wolfgang Friedrich Wilhelm Dietz, New Hope, Pa.

[73] Assignee: RCA Corporation, New York, N.Y.

[22] Filed: Nov. 6, 1974

[21] Appl. No.: 521,422

[30] Foreign Application Priority Data
Aug. 19, 1974 United Kingdom............. 36330/74

[52] U.S. Cl. ................ 315/399; 315/387; 315/408
[51] Int. Cl.² .................... H01J 29/70; H01J 29/76
[58] Field of Search ....... 315/387, 399, 408; 331/20

[56] References Cited
UNITED STATES PATENTS

| | | | |
|---|---|---|---|
| 2,912,651 | 11/1959 | Leeds | 331/20 |
| 3,452,244 | 6/1969 | Dietz | 315/408 |
| 3,749,966 | 7/1973 | Ahrens et al. | 315/408 |
| 3,824,494 | 7/1974 | Wilcox | 331/20 |

Primary Examiner—T. H. Tubbesing
Assistant Examiner—T. M. Blum
Attorney, Agent, or Firm—E. M. Whitacre; Paul J. Rasmussen

[57] ABSTRACT

A start-up circuit for a deflection system comprises a deflection circuit including a first oscillator which produces a first signal for producing a deflection signal in a deflection winding in response to the first signal. A second oscillator coupled to the first oscillator controls the frequency and phase of the first oscillator when a direct current potential is coupled to said second oscillator. A rectifying circuit coupled to the deflection circuit and the second oscillator provides the direct current potential to the second oscillator when the deflection signal is being produced.

5 Claims, 1 Drawing Figure

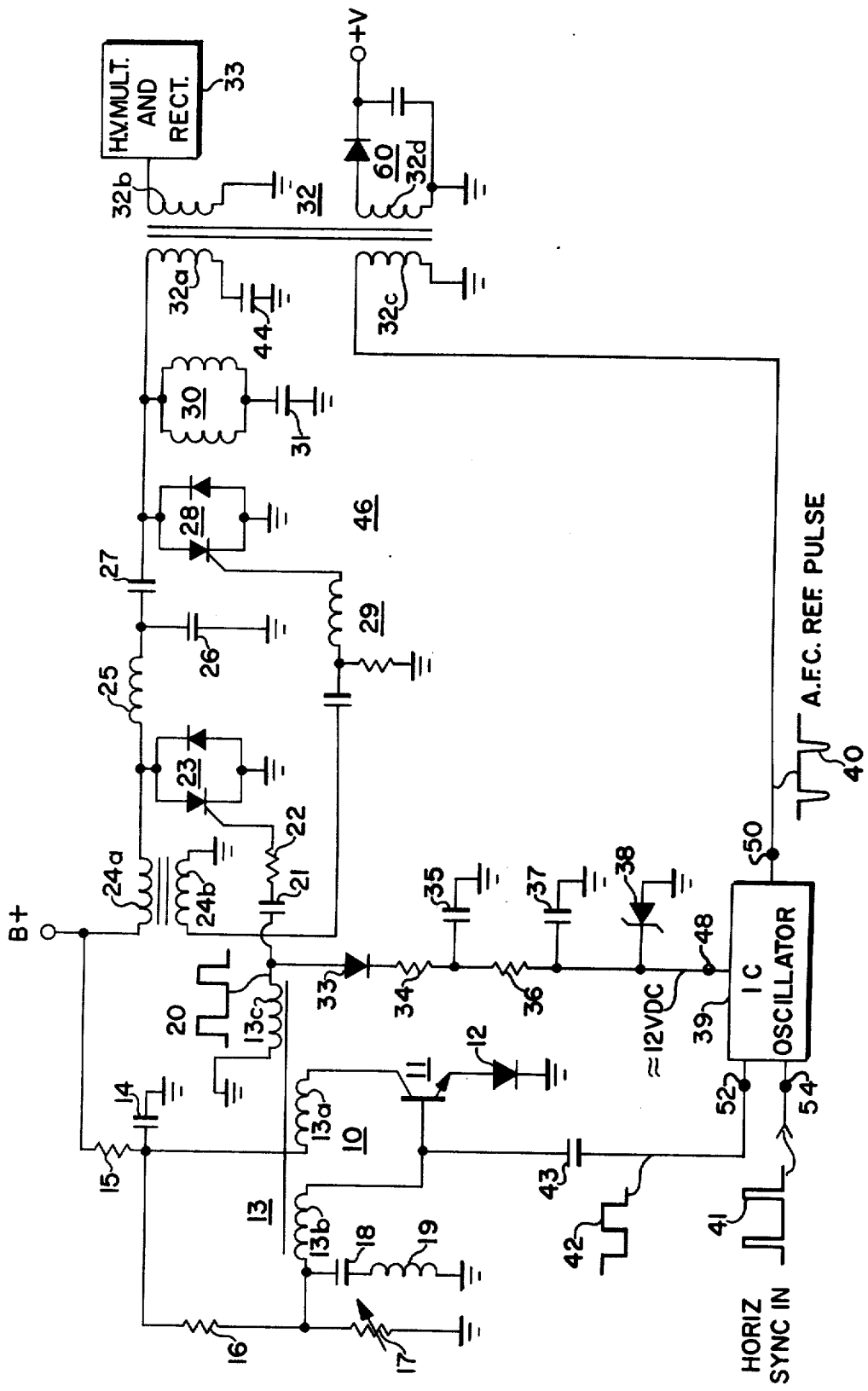

START-UP CIRCUIT FOR A DEFLECTION SYSTEM

BACKGROUND OF THE INVENTION

This invention relates to a start-up circuit for a deflection system.

Various deflection system designs have been utilized in television receivers. More recent designs have utilized an integrated circuit, which includes an oscillator, to provide drive signals to switch the deflection system at a line frequency rate or a field frequency rate. Additionally, many of these integrated circuit designs have included automatic frequency and phase control, pulse shaping and noise immunity circuitry. Due to the number of discrete components eliminated by this type of integrated circuit, deflection system costs have been reduced. Also deflection systems utilizing this type of integrated circuit are more reliable, provide improved system noise immunity and provide for easier deflection system assembly.

Integrated circuits generally must, however, be supplied with a relatively low direct current voltage, for example, in a range of 4 to 12 VDC. Television receivers which are so-called "hot chassis" receivers, that is, do not have a 60 Hz power transformer, frequently drive low direct current voltages such as aforementioned by utilizing a dropping resistor and an appropriate voltage limiting device such as a zener diode. These dropping resistors, however, dissipate considerable amounts of power. The absence of a 60 Hz transformer eliminates the possibility of utilizing a low voltage winding of the transformer for providing low voltage for operating the integrated circuit oscillator assembly.

It is desirable to have the deflection circuit oscillator provide useful drive signals as soon as possible after turn-on of the receiver in order to begin deflection circuit operation as soon as possible. The typical integrated circuit oscillator assembly requires approximately 30 percent of nominal direct current voltage before the oscillator will provide drive signals. In contrast, the typical discrete component oscillator of the type which the integrated circuit replaced required approximately 10 percent of nominal direct current voltage to provide drive signals.

In accordance with the invention, a start-up circuit for a deflection system comprises deflection means, including a first oscillator which produces a first signal, for producing a deflection signal in a deflection winding in response to the first signal. A second oscillator is coupled to the first oscillator for controlling the frequency and phase of the first oscillator when a direct current operating potential is coupled to the second oscillator. Rectifying means coupled to the deflection means and the second oscillator provide the direct current potential to the second oscillator when said deflection signal is being produced.

A more detailed description of the invention is given in the following description and accompanying drawing.

DESCRIPTION OF THE INVENTION

The sole FIGURE is a schematic diagram, partially in block form, of a deflection system embodying a start-up circuit according to the invention. This circuit includes a conventional blocking oscillator 10, a deflection system 46 similar to that disclosed in U.S. Pat. No. 3,452,244 and a conventional integrated circuit oscillator 39.

The blocking oscillator 10 includes a switching transistor 11 having the emitter coupled through a base-emitter junction reverse breakdown protection diode 12 to reference potential. The collector is coupled through a series combination of a winding 13a of a blocking oscillator transformer 13 and a resistor 15 to a source of relatively high direct current potential (B+) which may be derived by rectifying the AC line voltage directly. The junction of winding 13a and resistor 15 is coupled through a bypass capacitor 14 to reference potential. A series combination of a resistor 16 and a variable resistor 17 coupled between B+ and reference potential form a voltage divider which provides a direct current bias which is coupled through a feedback winding 13b of transformer 13 to the base electrode of transistor 11. A series resonant circuit including a capacitor 18 and an inductor 19 are coupled between the junction of resistors 16 and 17 and reference potential and determine the pulse width generated by the blocking oscillator 10. Capacitor 18 also operates in conjunction with other components in the feedback network to determine the period of the oscillator. A winding 13c of the blocking oscillator transformer 13 is an output winding from which is obtained a series of pulses shown in waveform 20. In the free running state oscillator 10 is selected to produce pulses at approximately the horizontal deflection scanning rate, that is, approximately 15,750 Hz. To provide for optimum synchronization of the oscillator 10 in a manner to be described subsequently, a free running state which produces pulses at a rate somewhat lower than the horizontal deflection scanning rate is generally selected. Oscillator 10 will begin to operate when the B+ supply has reached approximately 10 percent of its nominal level.

A first terminal of winding 13a is coupled to reference potential and the other terminal is coupled through a series combination of a capacitor 21 and a resistor 22 to the gate electrode of an SCR which forms one-half of a commutating switch 23 of the horizontal deflection circuit 46. The bottom of switch 23 is coupled to reference potential and the top of switch 23 is coupled through an input reactor 24a to the source of B+. Commutating switch 23 is also coupled through a series combination of a commutating coil 25 and a commutating capacitor 27 to the top of a trace switch 28. An auxiliary capacitor 26 is coupled from the junction of coil 25 and capacitor 27 to reference potential and aids in the transfer of energy from the input reactor to the rest of the deflection circuit. The top of trace switch 28 is coupled through a pair of deflection coils 30 and an S-shaping capacitor 31 to reference potential. Trace switch 28 is also coupled through a series combination of a primary winding 32a of a horizontal output transformer 32 and a DC blocking capacitor 44 to reference potential. A secondary winding 32b of the transformer 32 supplies pulses during each horizontal retrace interval to the high voltage multiplier rectifier assembly 33 which provides an ultor voltage for a television picture tube (not shown). Winding 24b of the input reactor is coupled through a resonant waveshaping network 29 for supplying gate signals to the SCR of trace switch 28 to enable it for conduction during a portion of the trace interval of each deflection cycle.

In operation, when the receiver is turned on and the B+ potential is provided, the transistor 11 is turned on when the voltage at the junction of resistors 16 and 17 reaches a level sufficient to forward bias the base-emitter junction of transistor 11 and diode 12. When transistor 11 goes into conduction, current flow through winding 13a of blocking oscillator transformer 13 develops a voltage across windings 13b and 13c. The voltage developed across winding 13b, polarized with respect to windings 13a and 13c in a manner shown by polarization dots, further enhances the conduction of transistor 11 and, also, accumulates a charge on capacitor 18 which makes the junction of resistors 16 and 17 negative with respect to the bottom of the capacitor 18. When the current in winding 13a stops changing the capacitor 18 and inductor 19 ring to determine the duration of saturation of transistor 11, then the accumulated charge on capacitor 18 reverse biases the base-emitter junction of transistor 11 and the field in transformer 13 collapses. Capacitor 18 discharges at a rate determined by the capacitance value of capacitor 18, the resistance values of resistors 15, 16 and 17, and the B+ voltage. After the capacitor 18 is discharged to a voltage which again forward biases the base-emitter junction of transistor 11, the aforementioned cycle is repeated. The signal developed by the winding 13c is shown in waveform 20.

The signal developed by winding 13c is coupled to the gate of the SCR of the commutating switch 23 and initiates commutation of the deflection system 46 upon each positive transition of the signal 20. During the commutation interval charge, which has been accumulated on the capacitors 26 and 27 from B+ via input reactor 24a and commutating coil 25 during the interval when the commutating switch 23 was not conductive, is utilized to enhance the current flow through the yoke windings 30 and the winding 32a of flyback transformer 32. During the trace interval the trace switch 28 conducts through the diode during the first half of the trace interval and through the SCR during the second half of the trace interval. The SCR of the trace switch 28 is gated by means of voltage developed from winding 24b of the input reactor 24a via the resonant peaking circuit 29. Current developed in winding 32a of the flyback transformer 32 during each deflection cycle produces a voltage into windings 32b and 32c. The voltage pulse developed in winding 32c is as shown in waveform 40.

As described above, it can be seen that the blocking oscillator 10 operating in a manner which produces a signal as shown in waveform 20 having a frequency of approximately 15,750 and operating in conjunction with the deflection circuit 46 provides for nearly normal operation of the deflection circuit 46 shortly after turn-on of the receiver. However, the blocking oscillator initially is not synchronized with the signal being received by the television receiver.

A series combination of a rectifier diode 33 and a resistor 34 is coupled between the winding 13c and a filter capacitor 35. The other terminal of filter capacitor 35 is coupled to reference potential. A resistor 36 is coupled between the junction of resistor 34 and capacitor 35 and a power input terminal 48 of an IC oscillator 39. A parallel combination of a filter capacitor 37 and a zener diode 38 is coupled between terminal 48 and reference potential. The zener diode is coupled across the final filter capacitor 37 to ensure that the voltage at terminal 48 does not exceed the selected values which may be about 12 volts DC. An AFPC feedback input terminal 50 of IC oscillator 39 is coupled to the winding 32c of flyback transformer 32. An output terminal 52 of IC oscillator 39 is coupled by means of a capacitor 43 to the base electrode of transistor 11 of blocking oscillator 10.

It may be noted that, even though the diode 33 is coupled to winding 13c which provides a low amplitude signal from which may be derived a low direct current voltage, the diode may be coupled to any point in the blocking oscillator or the deflection system which provides a low amplitude signal. For example, the diode 33 may be coupled to a tap or an extra winding on input reactor 24a or a tap on existing windings or an extra winding on flyback transformer 32.

In operation, signals produced by winding 13c of blocking oscillator transformer 13 having, for example, a peak-to-peak voltage of 20 volts, is rectified by diode 33, filtered by means of resistors 34 and 36 and capacitors 35 and 37 and limited by zener diode 38 to provide a low level direct current voltage for operating IC oscillator 39 with a very minimum of power dissipation. The horizontal synchronizing pulses recoeverd by signal processing circuitry (not shown) from signal received by the television receiver are shown in waveform 41. These synchronizing pulses are coupled to the input terminal 54 of the IC oscillator 39. These synchronizing pulses stabilize the frequency and phase of the IC oscillator 39 and produce synchronizing pulses shown in waveform 42 which are relatively independent of any noise associated with horizontal sync pulses shown in waveform 41.

Since the free running frequency of the blocking oscillator 10 is generally selected somewhat lower than 15,750 Hz., positive transitions of the synchronizing signal at terminal 52 provide for synchronization of the blocking oscillator by initiating the conduction of transistor 11 prior to that which would occur as a result of the discharge of the capacitor 18. Thus, the frequency of the signal generated by the winding 13c as shown in waveform 20 in the presence of synchronizing signal 42 will be the same as the frequency of the horizontal sync signal shown in waveform 41. In order that the phase of the current developed in the deflection windings 30 of the flyback transformer 32 be correct with respect to the phase of the horizontal sync signals shown in waveform 41, the voltage developed by winding 32c of the flyback transformer 32, shown as waveform 40, is coupled to the terminal 50 and is compared to the horizontal sync signal coupled to the terminal 54 to provide for a correction of the phase of the signal 42 developed at the output terminal 52.

The afore-described start-up circuit according to the invention is particularly useful when the low voltage required for other parts of the television receiver are obtained from the horizontal deflection circuit such as by rectifying by means of a network 60 the horizontal rate energy obtained from a winding 32d. Since the low voltage developed by winding 32d would not be present until the horizontal circuit operates, some means are necessary to provide for start-up of the horizontal deflection circuit. This function is provided by the oscillator 10 in its free running state. Stable oscillator 39 then completes a closed loop with the horizontal deflection circuit and oscillator 10 to ensure stable operation shortly after the receiver is turned on. Although blocking oscillator 10 may be in discrete component form as described, it is relatively efficient and inexpensive and provides for quick starting of the deflection circuit 46. In this manner, the relatively inexpensive integrated circuit oscillator 39 may then derive its low voltage operating current from the deflection system without requiring a separate and costly low voltage line frequency rectifying assembly or a highly dissipative voltage divider network.

What is claimed is:

1. In a deflection system a start-up circuit comprising:

a deflection generator including a first oscillator which produces a first signal for producing a deflection signal in a deflection winding in response to said first signal;

second oscillator means coupled to said first oscillator for controlling the frequency and phase of said first oscillator; and rectifying means coupled to said deflection means and to said second oscillator for providing a direct current operating potential to said second oscillator when said deflection signal is being produced.

2. A start-up circuit according to claim 1 wherein said second oscillator means is an integrated circuit.

3. A start-up circuit according to claim 2 wherein said deflection generator is coupled to said second oscillator means for providing said second oscillator means with a feedback signal and said second oscillator means includes a source of reference signals and a phase comparison means for comparing the phase relationship of said feedback signal and said reference signal for controlling the frequency and phase of the first oscillator.

4. A start-up circuit according to claim 3 wherein said first oscillator is a free running oscillator and said first signal has a free running frequency less than the frequency of said reference signal.

5. A start-up circuit according to claim 4 wherein said rectifying means includes means for limiting the maximum level of said direct current potential.

* * * * *